(12) United States Patent
Egger et al.

(10) Patent No.: US 12,548,928 B2
(45) Date of Patent: Feb. 10, 2026

(54) CIRCUIT-BOARD-AND-CONNECTOR ASSEMBLY AND A METHOD OF PRODUCING THEREOF

(71) Applicant: Continental Automotive Technologies GmbH, Hannover (DE)

(72) Inventors: Andreas Egger, Groß-Enzersdorf (AT); Alexander Raab, Vienna (AT); Marius Pascut, Vienna (AT); Eero Malinen, Vienna (AT)

(73) Assignee: AUMOVIO Germany GmbH, Frankfurt am Main (DE)

( * ) Notice: Subject to any disclaimer, the term of this patent is extended or adjusted under 35 U.S.C. 154(b) by 297 days.

(21) Appl. No.: 18/031,742

(22) PCT Filed: Sep. 29, 2021

(86) PCT No.: PCT/DE2021/200130
§ 371 (c)(1),
(2) Date: Apr. 13, 2023

(87) PCT Pub. No.: WO2022/078556
PCT Pub. Date: Apr. 21, 2022

(65) Prior Publication Data
US 2023/0411877 A1 Dec. 21, 2023

(30) Foreign Application Priority Data

Oct. 13, 2020 (DE) ...................... 10 2020 212 883.9

(51) Int. Cl.
*H01R 13/02* (2006.01)
*H01R 12/58* (2011.01)
(Continued)

(52) U.S. Cl.
CPC ........... *H01R 12/716* (2013.01); *H01R 12/58* (2013.01); *H01R 12/724* (2013.01)

(58) Field of Classification Search
CPC .... H01R 12/716; H01R 12/58; H01R 12/724; H01R 43/205; H05K 3/28; H05K 3/326; H05K 3/4015
See application file for complete search history.

(56) References Cited

U.S. PATENT DOCUMENTS

| 5,336,095 A | 8/1994 | Walburn et al. |
| 2004/0112884 A1* | 6/2004 | Uhl .................. H05K 1/0206 219/202 |

(Continued)

FOREIGN PATENT DOCUMENTS

| DE | 102018101670 B3 | 4/2019 |
| EP | 3489082 A1 | 5/2019 |
| EP | 3621160 A1 | 3/2020 |

OTHER PUBLICATIONS

International Search Report and Written Opinion dated Jan. 12, 2022 from corresponding International patent application No. PCT/DE2021/200130.

(Continued)

*Primary Examiner* — Abdullah A Riyami
*Assistant Examiner* — Nelson R. Burgos-Guntin

(57) ABSTRACT

A printed circuit board-and-plug arrangement comprises a printed circuit board from which at least one electrically conductive contact lug which is electrically connected to at least one conductor track of the printed circuit board protrudes, and a plug housing composed of insulating material, which plug housing has at least one opening, wherein a metal strip or metal wire is embedded in the insulating material so that at least a portion of the metal strip or the metal wire protrudes into the opening, wherein the plug housing is releasably connected to the printed circuit board so that the contact lug is inserted into the opening and thereby comes into contact with the portion, wherein the longitudinal direction of the contact lug and the longitudinal (Continued)

Figure 1:
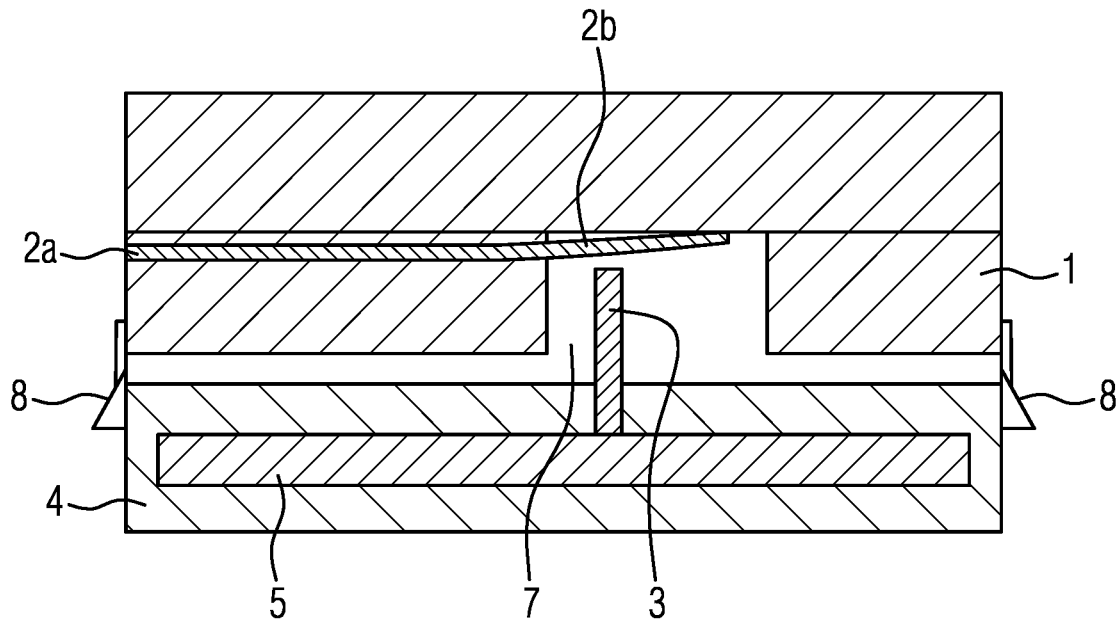

direction of the portion run perpendicularly in relation to one another.

20 Claims, 5 Drawing Sheets

(51) Int. Cl.
*H01R 12/71* (2011.01)
*H01R 12/72* (2011.01)

(56) References Cited

U.S. PATENT DOCUMENTS

| | | | |
|---|---|---|---|
| 2005/0173394 A1* | 8/2005 | Bohlender | H01H 37/761 |
| | | | 219/202 |
| 2005/0205552 A1* | 9/2005 | Han | F24H 3/0441 |
| | | | 219/540 |
| 2010/0243638 A1* | 9/2010 | Niederer | H05B 3/06 |
| | | | 219/542 |
| 2012/0248091 A1* | 10/2012 | Bohlender | F24H 1/009 |
| | | | 29/831 |
| 2015/0333596 A1* | 11/2015 | Berkouk | H05K 3/4015 |
| | | | 310/71 |
| 2019/0229464 A1 | 7/2019 | Russo et al. | |
| 2019/0238025 A1* | 8/2019 | Berkouk | H01R 13/02 |
| 2020/0313333 A1 | 10/2020 | Ho | |

OTHER PUBLICATIONS

Office Action dated Aug. 6, 2021 from corresponding German patent application No. 10 2020 212 883.9.

\* cited by examiner

CIRCUIT-BOARD-AND-CONNECTOR ASSEMBLY AND A METHOD OF PRODUCING THEREOF

A circuit-board-and-connector assembly and a method of producing thereof

In general, electronics use separate plugs in order to be able to connect electronic circuits on a printed circuit board to external devices. In this case, manual handling is required in order to achieve a connection between a plug and a mating plug. However, mechatronic parts (plugs and mating plugs) create costs. Plug solutions without traditional plugs typically require high forces or additional handling when releasing the connection. It is not technically feasible to go through multiple connection-disconnection cycles with push and pull forces.

A standard connection system for printed circuit boards can be used. While this has the advantage of usually being releasable, it has the disadvantage of requiring manual handling and requiring two mechatronic parts per connection, this increasing costs and affecting the design.

As an alternative, a printed circuit board edge connector can be used. This also constitutes a releasable connection and the plug is advantageously integrated into the printed circuit board. The disadvantage, however, is that certain requirements are placed on the surface material on both sides of the printed circuit board; gold is commonly required for plating in order to provide corrosion resistance. In addition, the direction of connection requires the printed circuit board to be pushed laterally into place, this often being awkward in automotive applications.

Another connection option is fork contacts, which can be simply pressed into place. However, when multiple contacts are required in an application, disconnection of the connection can be difficult due to the connection forces typically observed. Disconnection can introduce stress into the solder or press-fit connections.

Finally, a SKEDD connector can be used, which constitutes a simple interface and requires low connection forces. However, disconnection of the connection requires manual handling or manipulation that requires special equipment.

DE 10 2018 101 670 B3 discloses a plug-in connector which is intended to be connected to a printed circuit board, but there plug-in contacts are formed in the plug-in connector and make contact there with connection conductors which may be inserted into a housing of the plug-in connector by means of an insulation-displacement connection. The printed circuit board only has contact openings into which the plug-in contacts are inserted when connecting the plug-in connector to the printed circuit board.

First of all, one or more connection lines therefore have to be laboriously inserted into the housing of the plug-in connector and then the plug-in contacts have to be plugged into this housing perpendicularly with respect to the insertion direction of the connection lines, as a result of which the connection lines are electrically and mechanically connected to the plug-in contacts by means of the insulation-displacement contacts. Only then is the prefabricated plug-in connector connected to the printed circuit board, the plug-in contacts only now being pushed into the corresponding contact openings in the printed circuit board in order to establish contact there.

The object of the disclosure is therefore to specify a printed circuit board-and-plug arrangement and a method of producing thereof which is inexpensive and can be carried out in an easy-to-handle manner.

The object is achieved by a method for producing a printed circuit board-and-plug arrangement as claimed in claim 1. Advantageous developments and embodiments are specified in the dependent claims.

Accordingly, a printed circuit board-and-plug arrangement has a printed circuit board from which at least one electrically conductive contact lug which is electrically connected to at least one conductor track of the printed circuit board protrudes. Said printed circuit board-and-plug arrangement also has a plug housing composed of insulating material, which plug housing has at least one opening, wherein a metal strip or metal wire is embedded in the insulating material in such a way that at least a portion of the metal strip or the metal wire protrudes into the opening, wherein the plug housing is releasably connected to the printed circuit board in such a way that the contact lug protrudes into the opening and thereby comes into contact with the portion, wherein the longitudinal direction of the contact lug and the longitudinal direction of the portion run perpendicularly in relation to one another.

This printed circuit board-and-plug arrangement requires only slight forces when plug-connecting and releasing the connection. It also enables an uncomplicated printed circuit board design on the plug or contact lug side. The connection can be easily achieved by pushing and pulling the printed circuit board-and-plug housing connection. Another advantage is the low costs.

In a first embodiment of the printed circuit board-and-plug arrangement, the portion is embedded in the insulating material of the plug housing only on one side and is elastically bent by the contact lug protruding into the opening when the plug connection is made.

The portion of the metal strip or metal wire protruding into the opening of the plug housing is therefore designed as a leaf spring and is elastically bent by the contact lug of the printed circuit board protruding perpendicularly with respect thereto into the opening of the plug housing, with electrically conductive contact being established between the portion and the contact lug.

In an alternative embodiment of the printed circuit board-and-plug arrangement, the portion is embedded in the insulating material of the plug housing on both sides and is elastically deformed by the contact lug introduced into the opening.

The portion therefore forms a spring clamped on both sides here, which spring is deflected by the contact lug from its longitudinal direction.

In a further alternative of the printed circuit board-and-plug arrangement, the portion is embedded in the insulating material of the plug housing on both sides and is in contact with the bottom of the opening and the contact lug protruding into the opening is formed with a spring element which presses the contact lug against the portion.

Therefore, the spring force is not generated by the elasticity of the portion that is movably mounted in the opening here, but rather by an additional spring which is part of the contact lug.

In an advantageous development of the printed circuit board-and-plug arrangement, the printed circuit board can be provided with an insulating casing.

In order to create better contact between the portion and the end of the contact lug making electrical contact with it, that end of the contact lug which comes into contact with the portion can be structured in an advantageous manner.

For this purpose, the end can have teeth or can be pointed or rounded.

For this purpose, the portion can also have a mating structure which interacts with the structure.

An advantageous connection between the printed circuit board and the plug housing can advantageously be made, because it is simple, by means of a snap-action connection which can be locked and released without great handling forces.

Figure 2:
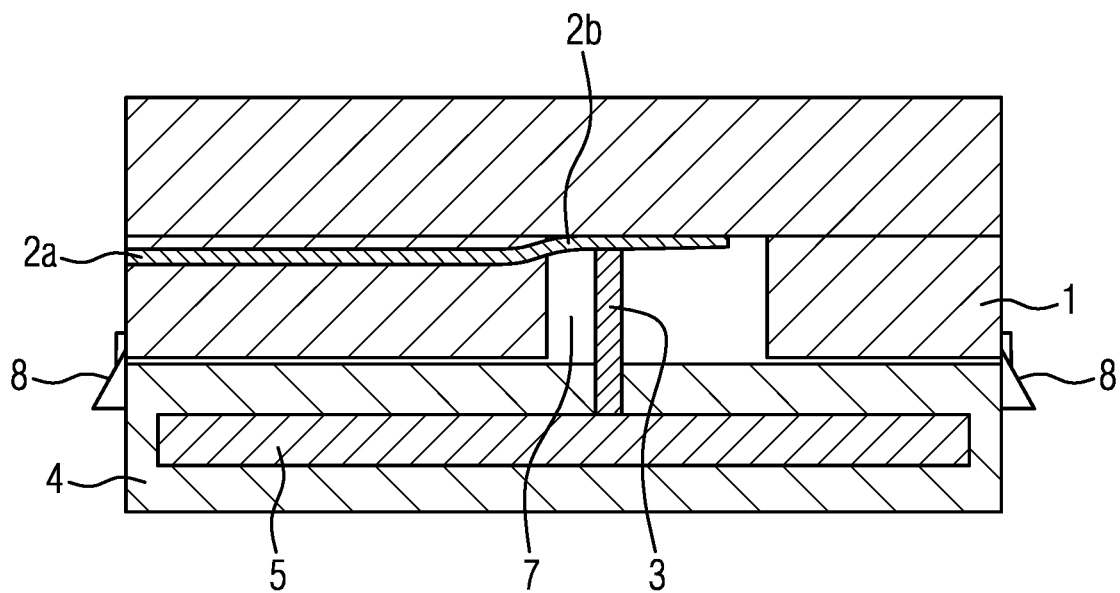
Figure 3:
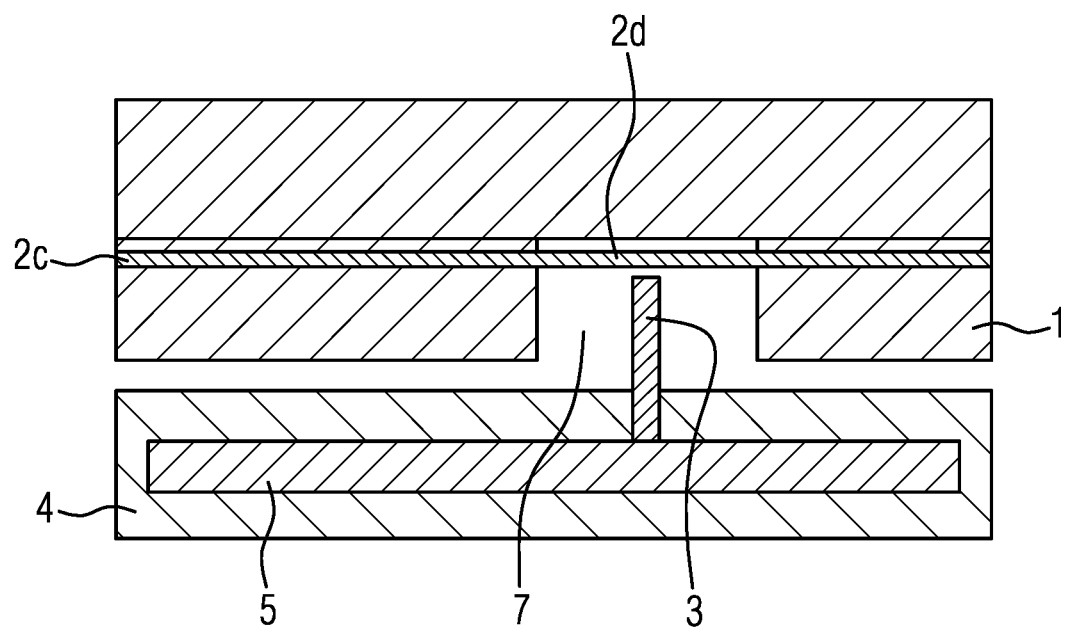
Figure 4:
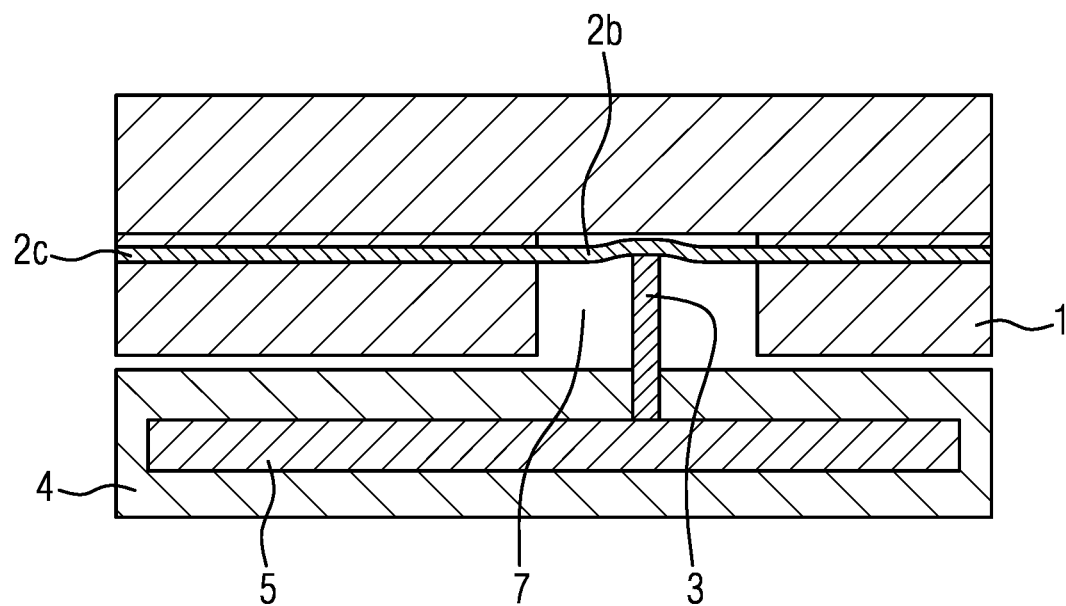
Figure 5:
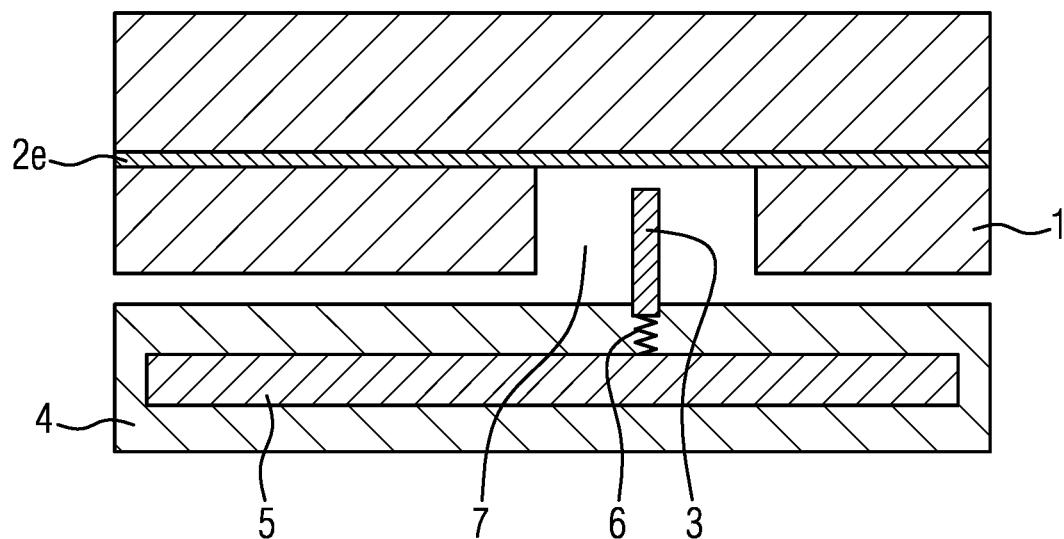
Figure 6:
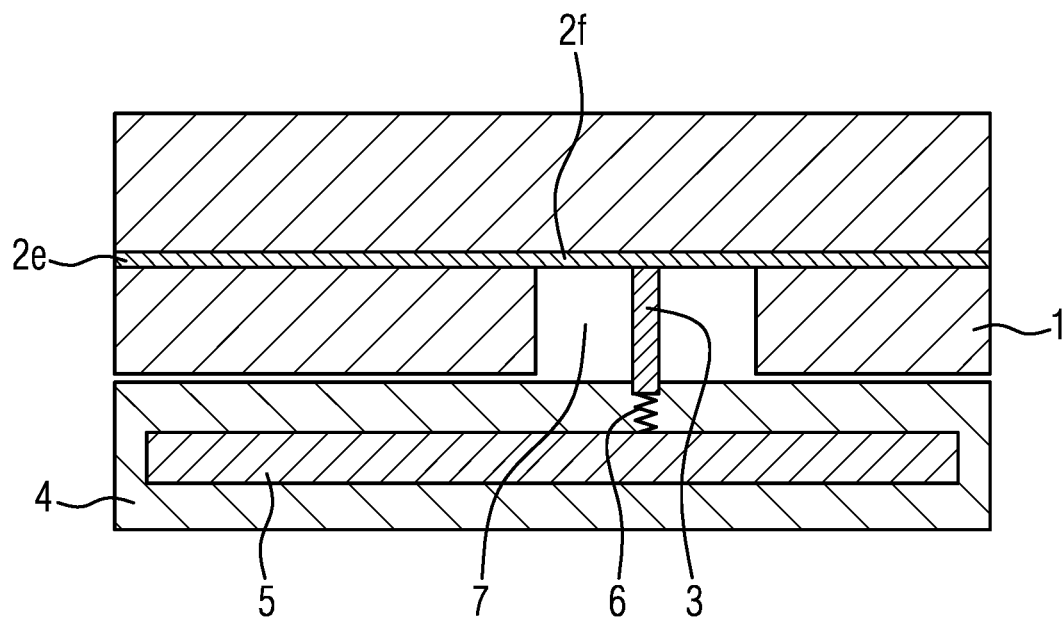
Figure 7:
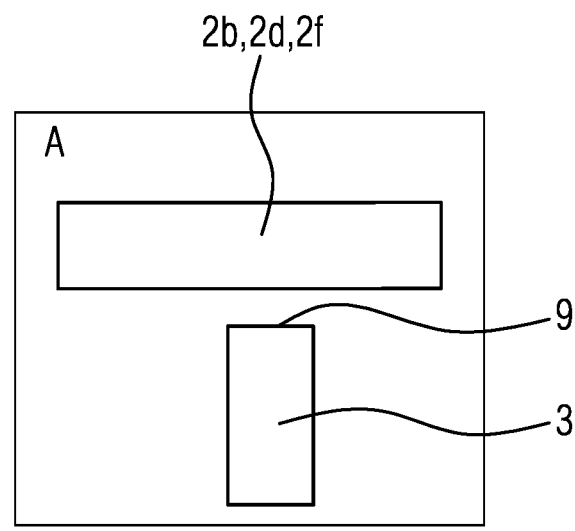
Figure 8:
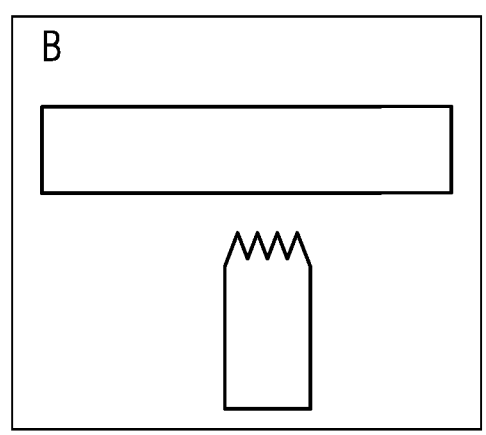
Figure 9:
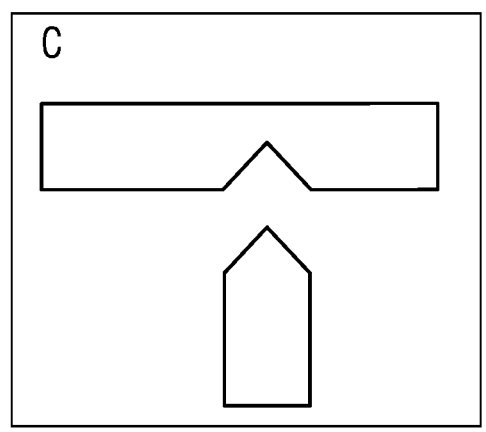
Figure 10:
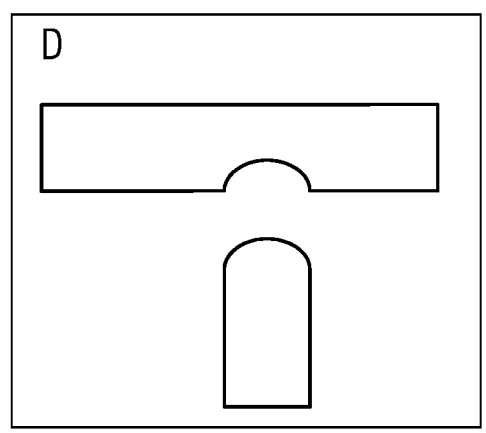

The object of the disclosure is intended to be described in more detail below with reference to exemplary embodiments with the aid of figures, in which:

FIG. 1 shows a first exemplary embodiment of a printed circuit board-and-plug arrangement in the open state of the contact point, FIG. 2 shows a first exemplary embodiment of a printed circuit board-and-plug arrangement in the closed state of the contact point, FIG. 3 shows a second exemplary embodiment of a printed circuit board-and-plug arrangement in the open state of the contact point, FIG. 4 shows a second exemplary embodiment of a printed circuit board-and-plug arrangement in the closed state of the contact point, FIG. 5 shows a third exemplary embodiment of a printed circuit board-and-plug arrangement in the open state of the contact point, FIG. 6 shows a third exemplary embodiment of a printed circuit board-and-plug arrangement in the closed state of the contact point, FIG. 7 shows a simple design of the contact point between the portion and the contact lug, FIG. 8 shows a first structured design of the contact point between the portion and the contact lug with teeth at the end of the contact lug, FIG. 9 shows a second structured design of the contact point between the portion and the contact lug with a point at the end of the contact lug and a corresponding recess in the portion, and FIG. 10 shows a third structured design of the contact point between the portion and the contact lug with a rounded portion at the end of the contact lug and a corresponding recess in the portion.

FIGS. 1 and 2 show a first exemplary embodiment of a printed circuit board-and-plug arrangement, respectively in the open state of the contact point and in the closed state of the contact point. A printed circuit board 5 is shown in a schematic manner, a contact lug 3 in the form of a contact pin being arranged on said printed circuit board. The contact lug 3 is intended to be connected to conductor tracks or other lines on or in the printed circuit board 5 here. The contact lug 3 is oriented perpendicularly with respect to the surface of the printed circuit board 5 in the exemplary embodiment shown, but its end can also run parallel to the surface of the printed circuit board 5 in principle. For the sake of clarity, only one contact lug 3 is shown, but, as is usual with printed circuit boards, a large number of such contact lugs 3 which are arranged in one or more rows can be provided.

In the exemplary embodiment illustrated in FIGS. 1 and 2, the printed circuit board 5 is provided with an insulating casing 4 in order to protect it from environmental influences. A first part of a snap-action connection 8 in the form of a latching lug is arranged on the casing 4.

A plug housing 1 composed of insulating material has an opening 7 into which the contact lug 3 can be inserted. A metal strip or a metal wire 2a runs in the insulating material of the plug housing 1, a portion 2b of which protrudes into the opening 7 and functions as a leaf spring there. The plug housing 1 also has the corresponding part of the snap-action device 8, which part can be designed, for example, as a clip and is pushed over the latching lug when the plug housing 1 and the printed circuit board 5 with its casing 4 are brought together and latches with it. When these components are brought together, the contact lug 3 is inserted into the opening 7 and makes contact with the portion 2b and, as can be seen in FIG. 2, pushes it to the side in a resilient manner and in this way achieves good electrical contact.

The connection between the plug housing 1 and the encased printed circuit board can be easily released in the usual way by means of the snap-action connection 8 and thus the electrical connection between the metal strip or metal wire 2a can also be easily interrupted by means of its portion 2b and the contact lug 3.

FIGS. 3 and 4 likewise show a second exemplary embodiment of a printed circuit board-and-plug arrangement in a schematic manner, with the same parts being provided with the same reference numerals. The snap-action connection 8 has been omitted for reasons of clarity, but should also be present there, although other releasable connections are also conceivable.

In contrast to the exemplary embodiment in FIGS. 1 and 2, the portion 2d of the metal strip or metal wire 2c is embedded with both of its ends in the insulating material of the plug housing 1 and is therefore fixed in the opening 7. When the contact lug 3 is inserted as the plug housing 1 is connected to the printed circuit board 5, the contact lug 3 pushes against the portion 2d and deforms it elastically, as a result of which electrical contact is made.

FIGS. 5 and 6 show a further alternative, respectively with the open and closed representation of the contact between the metal wire or metal strip 2e or its portion 2f which runs on the bottom of the opening 7. In this exemplary embodiment, the portion 2f cannot be deformed, but the contact pin 3 has a spring element 6 which, in the example shown, is arranged between the contact lug 3 and the printed circuit board 5, so that, when the plug housing 1 and the printed circuit board 5 are brought together, this spring element 6 is compressed and, due to the spring force that is established, the contact lug 3 is pushed against the portion 2f in order to establish electrical contact.

The end 9 of the contact lug 3 can, as shown in the exemplary embodiment in FIG. 7, be flat and push against a likewise flat surface of the portion 2b, 2d, 2f.

However, in order to improve the contact, it is possible, as shown in FIG. 8, to provide the end 9 of the contact lug 3 with structuring in the form of teeth or simple roughening in order to improve the electrical contact when the contact lug 3 presses against the portion 2b, 2d, 2f.

As an alternative, other ways of structuring the end 9 of the contact lug 3 can also be selected; for example, FIGS. 9 and 10 show a pointed portion or rounded portion of the end 9 of the contact lug 3, wherein, in a development, the portion 2b, 2d, 2f of the metal strip or metal wire 2a, 2c, 2e can be provided with a correspondingly shaped mating structure in order to improve the contact.

The printed circuit board-and-plug arrangement according to the disclosure represents a cost-effective and simple, pluggable and releasable implementation of a plug for a printed circuit board.

The invention claimed is:

1. A method of producing a printed circuit board-and-plug arrangement, comprising:
   a printed circuit board from which at least one electrically conductive contact lug which is electrically connected to at least one conductor track of the printed circuit board protrudes, and comprising a plug housing composed of insulating material, which plug housing has at least one opening, wherein a metal strip or metal wire is embedded in the insulating material so that at least a portion of the metal strip or the metal wire protrudes into the opening, wherein the plug housing is releasably connected to the printed circuit board so that the contact lug is inserted into the opening and thereby comes into contact with the portion, wherein longitudinal direction of the contact lug and longitudinal direction of the portion run perpendicularly in relation to one another.

2. The method as claimed in claim 1, wherein the portion is embedded in the insulating material of the plug housing only on one side and is elastically bent by the contact lug protruding into the opening.

3. The method as claimed in claim 1, wherein the portion is embedded in the insulating material of the plug housing on both sides and is elastically deformed by the contact lug protruding into the opening.

4. The method as claimed in claim 1, wherein the portion is embedded in the insulating material of the plug housing on both sides and is in contact with a bottom of the opening and the contact lug protruding into the opening is formed with a spring element which presses the contact lug against the portion.

5. The method as claimed in claim 1, wherein the printed circuit board is provided with an insulating casing.

6. The method as claimed in claim 1, wherein that end of the contact lug which comes into contact with the portion is structured.

7. The method as claimed in claim 6, wherein the end of the contact lug has teeth or is pointed or rounded.

8. The method as claimed in claim 7, wherein the portion has a mating structure which interacts with the structure.

9. The method for producing a printed circuit board-and-plug arrangement as claimed in claim 1, wherein the plug housing is releasably connected to the printed circuit board by means of a snap-action connection.

10. The method as claimed in claim 4,
   wherein the printed circuit board is provided with an insulating casing,
   wherein that end of the contact lug which comes into contact with the portion is structured,
   wherein the end of the contact lug has teeth or is pointed or rounded,
   wherein the portion has a mating structure which interacts with the structure, and
   wherein the plug housing is releasably connected to the printed circuit board by means of a snap-action connection.

11. A printed circuit board-and-plug arrangement, comprising:
   a printed circuit board from which at least one electrically conductive contact lug which is electrically connected to at least one conductor track of the printed circuit board protrudes, and comprising
   a plug housing composed of insulating material, which plug housing has at least one opening, wherein a metal strip or metal wire is embedded in the insulating material so that at least a portion of the metal strip or the metal wire protrudes into the opening,
   wherein the plug housing is releasably connected to the printed circuit board so that the contact lug is inserted into the opening and thereby comes into contact with the portion, wherein longitudinal direction of the contact lug and longitudinal direction of the portion run perpendicularly in relation to one another.

12. The arrangement as claimed in claim 11, wherein the portion is embedded in the insulating material of the plug housing only on one side and is elastically bent by the contact lug protruding into the opening.

13. The arrangement as claimed in claim 11, wherein the portion is embedded in the insulating material of the plug housing on both sides and is elastically deformed by the contact lug protruding into the opening.

14. The arrangement as claimed in claim 11,
   wherein the portion is embedded in the insulating material of the plug housing on both sides and is in contact with a bottom of the opening and the contact lug protruding into the opening is formed with a spring element which presses the contact lug against the portion.

15. The arrangement as claimed in claim 14,
   wherein the printed circuit board is provided with an insulating casing,
   wherein that end of the contact lug which comes into contact with the portion is structured,
   wherein the end of the contact lug has teeth or is pointed or rounded,
   wherein the portion has a mating structure which interacts with the structure, and
   wherein the plug housing is releasably connected to the printed circuit board by means of a snap-action connection.

16. The arrangement as claimed in claim 11,
   wherein the printed circuit board is provided with an insulating casing.

17. The arrangement as claimed in claim 11,
   wherein that end of the contact lug which comes into contact with the portion is structured.

18. The arrangement as claimed in claim 17,
   wherein the end of the contact lug has teeth or is pointed or rounded.

19. The arrangement as claimed in claim 18,
   wherein the portion has a mating structure which interacts with the structure.

20. The arrangement as claimed in claim 11,
   wherein the plug housing is releasably connected to the printed circuit board by means of a snap-action connection.

* * * * *